United States Patent [19]
Reddy et al.

[11] Patent Number: 5,375,097
[45] Date of Patent: Dec. 20, 1994

[54] SEGMENTED BUS ARCHITECTURE FOR IMPROVING SPEED IN INTEGRATED CIRCUIT MEMORIES

[76] Inventors: Chitranjan N. Reddy, 1848 Country Club Dr., Milpitas, Calif. 95035; Ajit K. Medhekar, 503 Bliss Ct., San Jose, Calif. 95136

[21] Appl. No.: 84,010

[22] Filed: Jun. 29, 1993

[51] Int. Cl.$^5$ .............................................. G11C 8/00
[52] U.S. Cl. ................... 365/230.06; 365/190
[58] Field of Search ............. 365/230.06, 230.01, 365/190

[56] References Cited

U.S. PATENT DOCUMENTS 5,161,121  11/1992  Cho ........................... 365/230.06 X
5,255,228  10/1993  Hatta et al. ................ 365/230.06 X Primary Examiner—Do Hyun Yoo
Attorney, Agent, or Firm—Limbach & Limbach

[57] ABSTRACT

A memory array wherein transfer bus length is reduced and segmented by arranging the column decoder select signals to run across the length of the word line to reduce the node capacitance seen by the corresponding memory cell. This transfer of low capacitance from the transfer bus, i.e., the critical path, to the select line, which is a non-critical path for speed, improves access speed.

5 Claims, 5 Drawing Sheets

SEGMENTED BUS ARCHITECTURE FOR IMPROVING SPEED IN INTEGRATED CIRCUIT MEMORIES

BACKGROUND OF THE INVENTION

1. Field of the Invention

The present invention relates to memory devices and, in particular, to an integrated circuit memory device architecture in which the column decoder select lines are used to create transfer bus segmentation, thereby reducing the capacitance seen by individual memory cells.

2. Discussion of the Prior Art

Speed and density are critical to successful semiconductor memory cell design. However, as memory density increases, bit line and transfer bus capacitances also increase, thereby slowing down cell access time. To improve cell access time, memory arrays are typically divided into segments to reduce the above-mentioned capacitances.

FIG. 1 shows a single row 100 of a typical static random access memory (SRAM) array that includes a matrix of rows and columns of memory cells. Those skilled in the art will appreciate that both the number of SRAM cells in an individual row of the array and the total number of rows in the array can vary widely. The illustrated row 100 includes sixteen individual conventional SRAM cells of the type shown in FIG. 2.

The FIG. 2 SRAM cell includes two cross-coupled field effect transistors connected between supply and ground via respective resistive loads to define complementary output nodes A and $\overline{A}$. Nodes A and $\overline{A}$ may be accessed for read and write operations by turning on the cell's internal pass gate transistors via the word line associated with the cell, thereby connecting nodes A and $\overline{A}$ to the complementary cell bit lines BL and $\overline{BL}$, respectively. The nature of the bias conditions applied to the word line and to the cell bit lines BL and $\overline{BL}$ will determine whether a read operation or a write operation is to be performed with respect to the accessed cell.

Referring back to FIG. 1, word line 1 is utilized to access a selected memory cell 40 in the row 100. The complementary data stored in SRAM cell 40 is placed on complementary bit lines BL0 and $\overline{BL0}$ by enabling the internal cell pass gate transistors associated with cell 40. The data from the bit lines BL0 and $\overline{BL0}$ is transferred to an associated transfer bus (i.e. complementary transfer buses TBUS1 and $\overline{TBUS1}$) 11 by enabling associated column select transistor pair 19 utilizing select signal SEL1. Select signal SEL1 is provided by a column decoder 15 in response to a corresponding four bit address (i.e. bits A0, /A0, A1 and /A1) provided to the column decoder 15 on address bus 6.

As further shown in FIG. 1, transfer bus (TBUS1/$\overline{TBUS1}$) 11 is connected to receive data from four individual SRAM cells. Each of these cells is controlled by a different column select transistor pair (i.e. transistor pairs 19, 23, 27, and 31) in each of four 4-cell groups that are selected by the four column decoders (i.e. column decoders 15, 16, 17 and 18, respectively) associated with the row 100.

That is, the circuit shown in FIG. 1 has a "by-four" architecture wherein a selected group 45 of four SRAM cells (i.e., cells 40, 41, 42 and 43) is selected by the column decoder 15. The data from these four cells is transferred onto four corresponding transfer buses (i.e., complementary transfer bus pairs 11, 12, 13 and 14).

The data on each of these transfer buses is amplified by a corresponding sense amplifier and provided to a corresponding input/output pin (i.e. I/O pins 7, 8, 9 and 10, respectively).

As shown in FIG. 1, in order to service each of the four groups of cells, each of the transfer buses must physically travel the entire length of the word line 1. Furthermore, the four column decoders are placed four bits, i.e. four cells, apart along the length of the word line. Thus, the length of the transfer bus for each bit is proportional to the length of the word line, creating additional capacitance on the transfer bus. This added capacitance is seen directly by the memory cells attached to the transfer bus through the column select transistors, thereby slowing memory access time.

It would, therefore, be highly desirable to have available a high density memory array architecture in which the transfer bus capacitance seen by individual memory cells is reduced, but with no area penalty.

SUMMARY OF THE INVENTION

The present invention provides an integrated circuit memory device having a segmented transfer bus architecture. The individual memory cells in a selected row of the memory cell array are divided into a plurality of groups of cells. Each group of cells includes x/n adjacent cells, where x is the total number of cells in the selected row and n is an integer greater than 1. The column select pass gate of each cell within a cell group responds to a column decoder select signal by passing data from the cells bit line to a group transfer bus associated with that cell group. The memory device further includes a plurality of column decoders. Each column decoder responds to a corresponding column address by providing the column decoder select signal to a column select pass gate of a single selected individual memory cell in each of the memory cell groups.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1A:
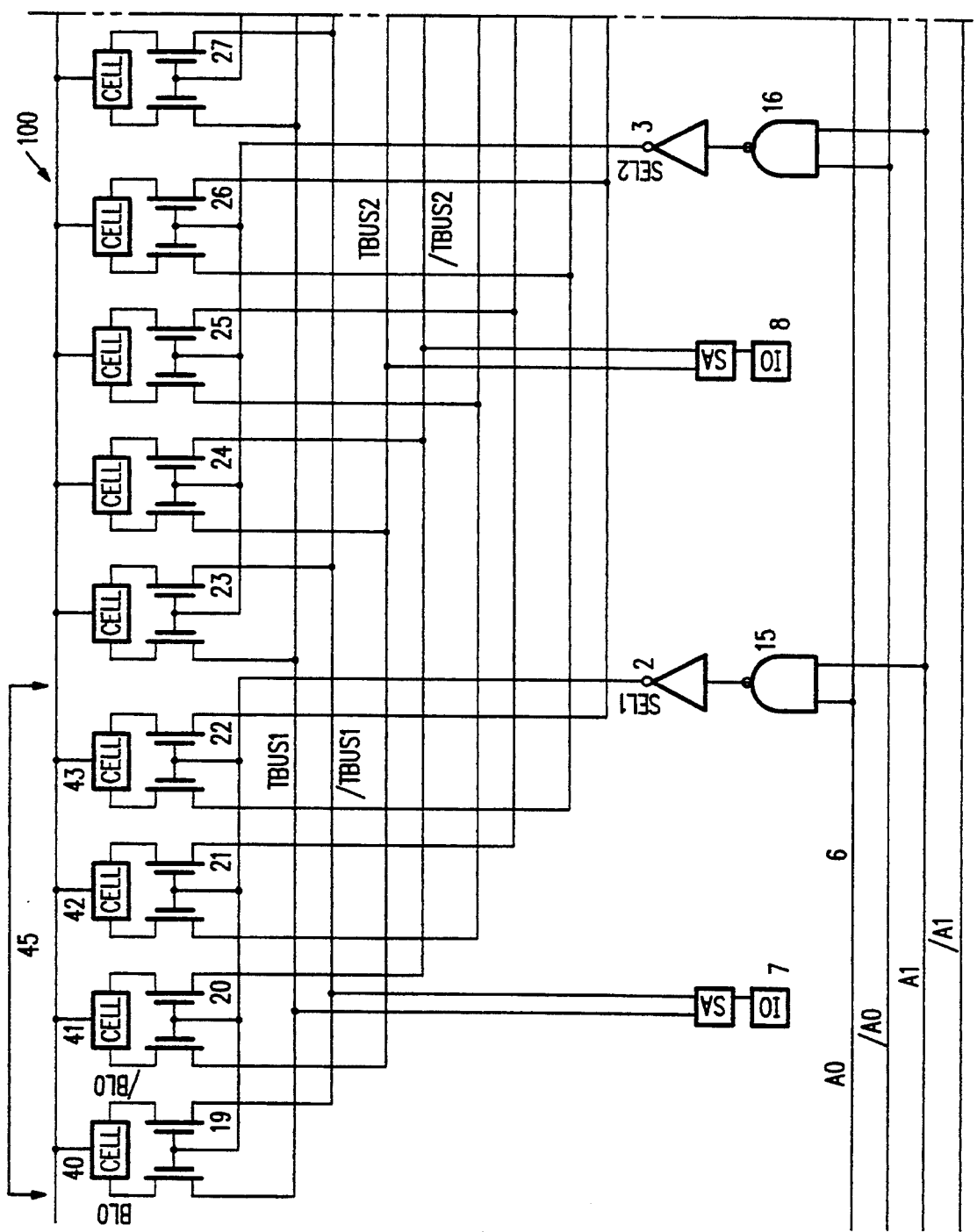
FIG. 1 is a schematic diagram illustrating a row of a conventional memory array in which the transfer bus for the row runs along the length of the word line for that row.
Figure 1B:
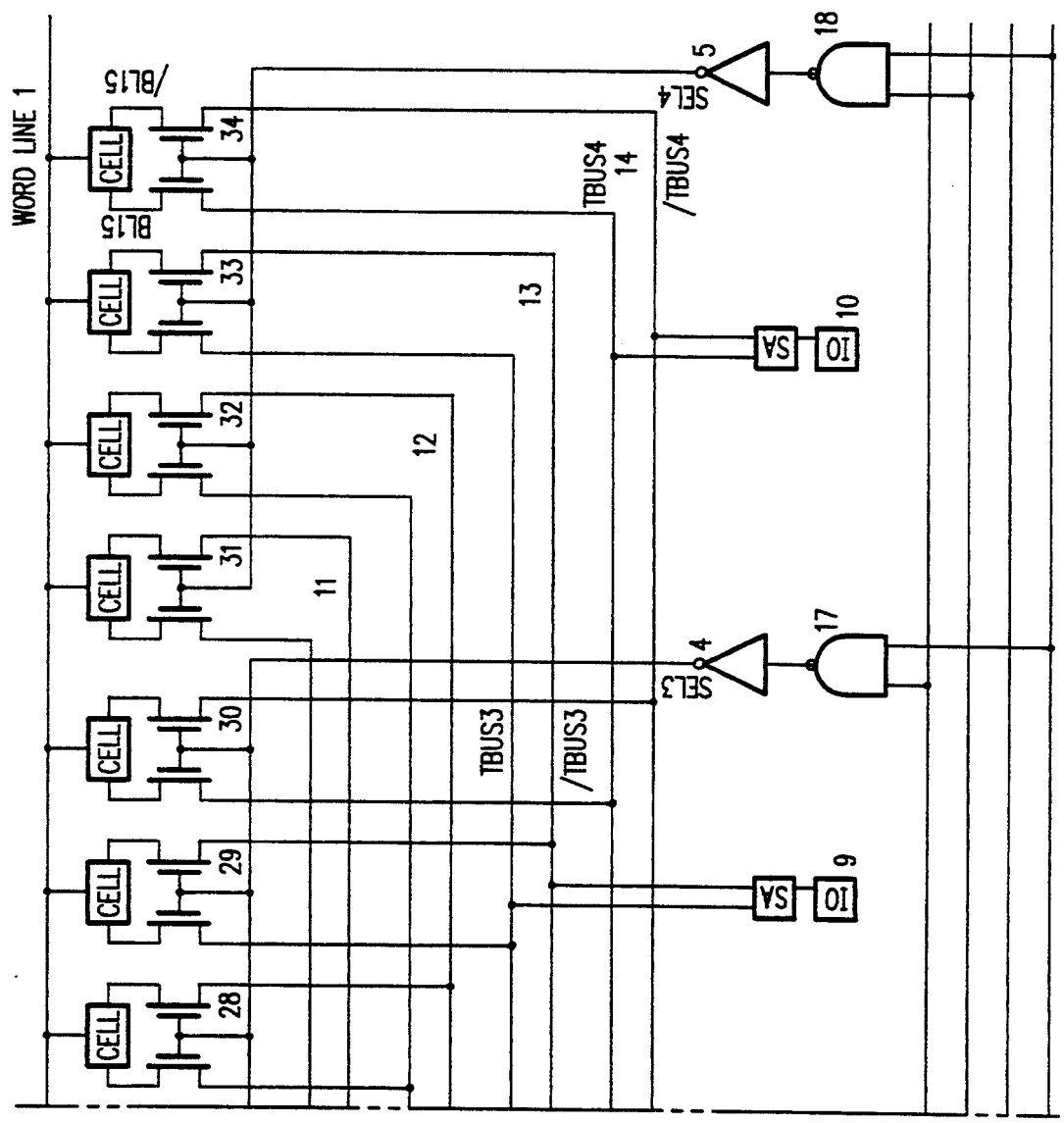
Figure 2:
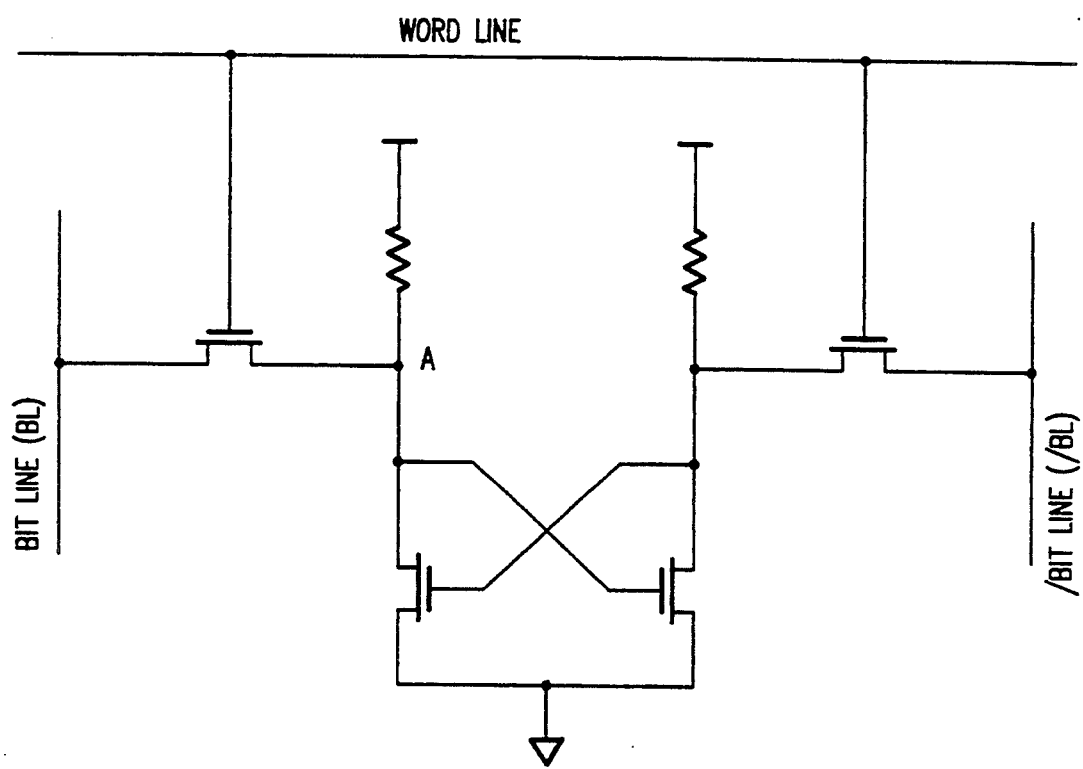
FIG. 2 is a schematic diagram illustrating a conventional SRAM cell and its connection to complementary bit lines via internal pass gates.
Figure 3A:
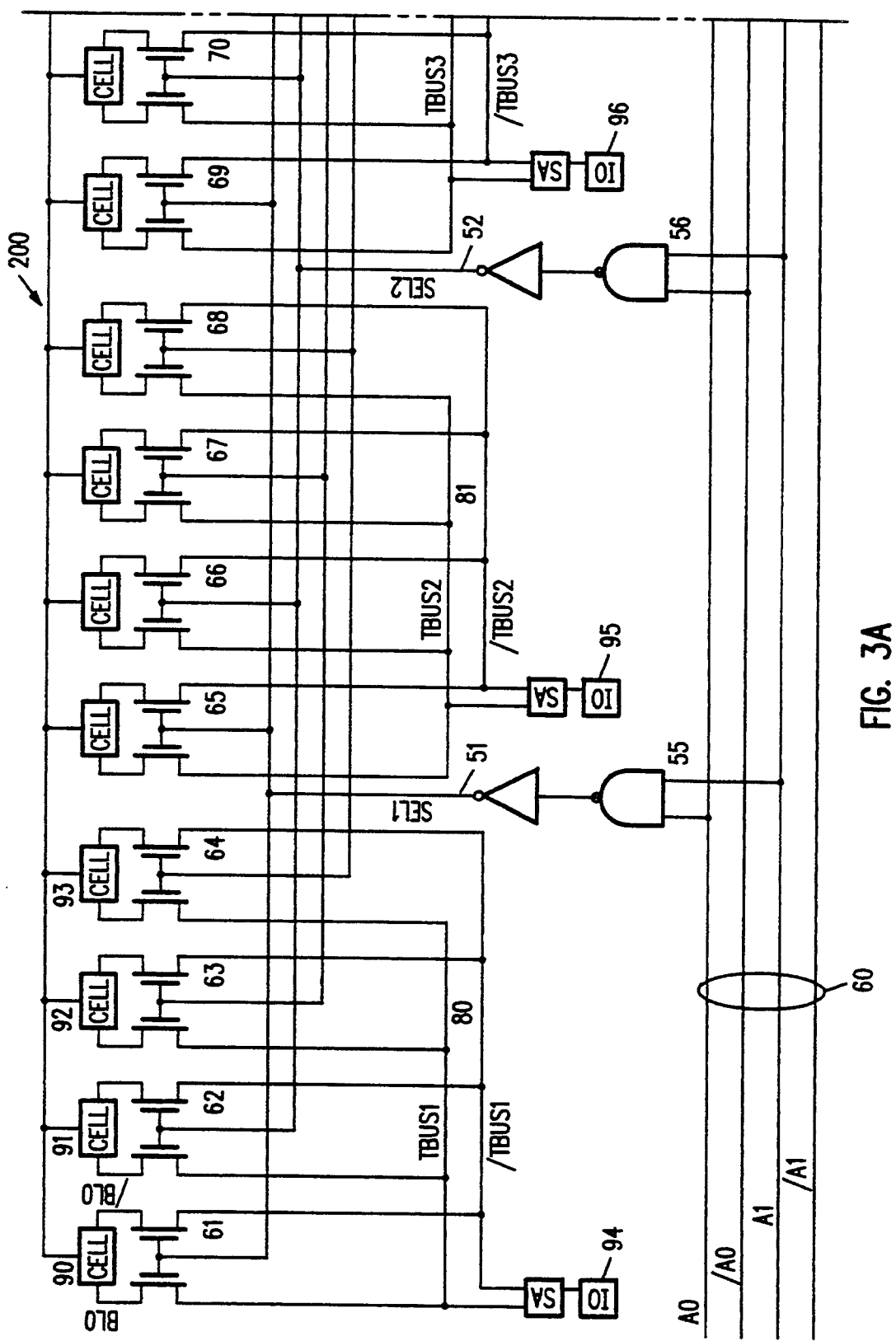
FIG. 3 is a schematic diagram illustrating a portion of a memory array in accordance with the present invention wherein the transfer bus is segmented.
Figure 3B:
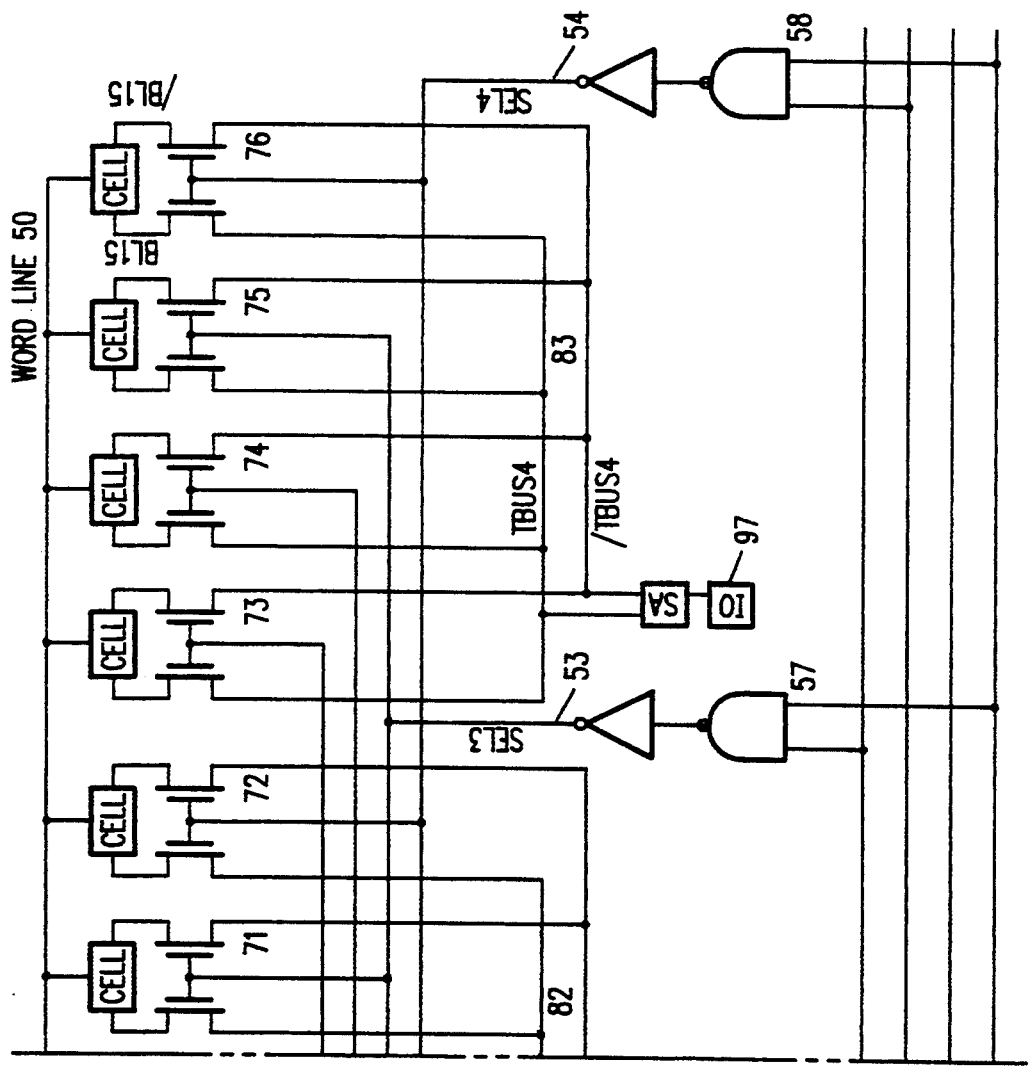

FIG. 3 shows an individual row 200 of a static random access memory (SRAM) array that includes a matrix (not shown) of rows and columns of individual SRAM memory cells. The individual SRAM cells may be of conventional design as shown in FIG. 2.

The row 200 shown in FIG. 3 includes sixteen SRAM cells connected to a word line 50. The sixteen cells are subdivided into four groups of four adjacent cells each.

For example, SRAM cells 90, 91, 92 and 93 define one group of cells.

Four individual SRAM cells, one cell in each of the four groups of adjacent cells, are selected by a corresponding one of four column decoders 55, 56, 57 and 58 associated with the row 200. For example, decoder 55 responds to a four bit address (i.e. bits A0, $\overline{A0}$, A1 and $\overline{A1}$) provided on address bus 60 by providing a select signal SEL1 via column select line 51 to each of column select transistor pairs 61, 65, 69 and 73. With word line 50 biased to enable the internal pass gates of all cells in the row 200, enabling of column select transistor pairs 61, 65, 69 and 73 results in transfer of data from the "left-handed" cell in each cell group to input/output pins 94, 95, 96 and 97, respectively, via corresponding transfer buses 80 (TBUS1/$\overline{TBUS1}$), (TBUS2/$\overline{TBUS2}$), 82 (TBUS3/$\overline{TBUS3}$) and 83 (TBUS4/$\overline{TBUS4}$), respectively.

The data from each of the transfer buses is amplified by a corresponding sense amplifier and sent to its corresponding input/output pin.

A similar cell select scheme is provided for each of the other column decoders 56, B7 and 58 associated with the row 200.

Thus, as shown in FIG. 3, and in accordance with the present invention, the four column decoder select lines SEL1–SEL4, rather than the transfer bus lines, run along the length of the word line 50 and thereby reduce the length of the transfer buses 80, 81, 82 and 83. The transfer bus length may, thus, be reduced based upon the number of column select transistor pairs (four in FIG. 3) to be selected by each of the select lines 51, 52, 53 and 54.

From this, one can optimize the ratio of the number of column select signals to transfer bus length independent of word line length. This transfer of load capacitance from the transfer bus, i.e., the critical data path, to the select lines, which are none-critical for speed, improves the access speed of the memory device.

Thus, the present invention provides a memory array wherein the transfer bus length has been segmented by arranging the column decoder select signals to run across the length of the word line to reduce the node capacitance seen by the corresponding memory cell bit line.

It should be understood that various alternatives to the embodiment of the invention described herein may be employed in practicing the invention.

For example, those skilled in the art will appreciate that the inventive concepts described above are not limited to SRAM devices, but may be successfully applied to a variety of other integrated circuit memory technologies, e.g., DRAMS. Thus, it is intended that the claims define the scope of the invention and that memory device architectures within the scope of these claims and their equivalents be covered thereby.

What is claimed is:

1. An integrated circuit memory device having a segmented transfer bus architecture, the memory device comprising a matrix of rows and columns of individual memory cells, each individual memory cell in a selected row of said matrix being connected to a corresponding word line and being responsive to a predefined signal provided on the word line for providing data from said memory cell to a bit line associated with said memory cell, the individual memory cells in said selected row being divided into a plurality of groups of memory cells, each group consisting of x/n adjacent memory cells, where x is the total number of memory cells in said selected row and n is an integer greater than 1, and wherein the bit line of each memory cell in a selected group of adjacent memory cells is connectable to a group transfer bus associated with the selected group via a column select pass gate associated with said memory cell, and wherein the column select pass gate responds to a column decoder select signal by passing data from the bit line to the associated group transfer bus, the memory device further comprising a plurality of column decoders, each column decoder responding to a corresponding column address by providing the column decoder select signal to a column select pass gate of a single selected memory cell in each of the groups of adjacent memory cells.

2. An integrated circuit memory device as in claim 1 and wherein the memory cells are SRAM cells.

3. An integrated circuit memory device as in claim 1 and wherein the memory cells are DRAM cells.

4. An integrated circuit memory device having a segmented transfer bus architecture, the memory device comprising a matrix of rows and columns of individual memory cells, each memory cell in a selected row of said matrix being connected to a corresponding word line, the memory cells in said selected row being divided into a plurality of groups of memory cells, each group consisting of x/n adjacent memory cells, where x is the total number of memory cells in said selected row and n is an integer greater than 1, and wherein each memory cell in said selected row includes first and second complementary data outputs connected, respectively, to first and second bit lines via respective first and second internal pass gates, the first and second internal pass gates being responsive to a predefined signal provided on the word line for passing data from the first and second data outputs, respectively, to the respective first and second bit lines, and wherein the first and second bit lines of each memory cell in a selected group of adjacent memory cells are connectable to a first and second transfer buses associated with the selected group, respectively, via a column select pass gate pair associated with said memory cell, and wherein the column select pass gate pair responds to a column decoder select signal by passing data from the first and second bit lines to the associated first and second transfer buses, respectively, the memory device further comprising a plurality of column decoders, each column decoder being responsive to a corresponding column address for providing the column decoder select signal to a column select pass gate pair of a single selected memory cell in each of the groups of adjacent memory cells.

5. An integrated circuit memory device as in claim 4 and wherein the memory cells are SRAM cells.

* * * * *